(12) United States Patent
Xia et al.

(10) Patent No.: US 10,796,035 B1
(45) Date of Patent: Oct. 6, 2020

(54) COMPUTING SYSTEM WITH SIMULATED HARDWARE INFRASTRUCTURE TO SUPPORT DEVELOPMENT AND TESTING OF MANAGEMENT AND ORCHESTRATION SOFTWARE

(71) Applicant: EMC Corporation, Hopkinton, MA (US)

(72) Inventors: Robert Guowu Xia, Shanghai (CN); Joseph James Longever, Jr., Dorchester, MA (US); Simon Alexander Jensen-Fellows, Acton, MA (US); Xiaoxia Shu, Shanghai (CN); Xiaoguang Fu, Shanghai (CN); Chao Wang, Shanghai (CN); Xingwang Cai, Shanghai (CN); Chao Wu, Shanghai (CN); Xin Lin, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 677 days.

(21) Appl. No.: 15/076,224

(22) Filed: Mar. 21, 2016

(51) Int. Cl.
*G06F 30/20* (2020.01)
(52) U.S. Cl.
CPC .................... *G06F 30/20* (2020.01)
(58) Field of Classification Search
None
See application file for complete search history.

(56) References Cited

U.S. PATENT DOCUMENTS

2013/0036323 A1* 2/2013 Goose ............... G06F 11/1484
714/4.11
2013/0297849 A1* 11/2013 Wagner .................. G06F 12/10
711/6

(Continued)

OTHER PUBLICATIONS

Matthias Sand et al., "Deterministic high-speed simulation of complex systems including fault injection," 2009, 2009 IEEE/IFIP International Conference on Dependable Systems & Networks, pp. 211-216 (Year: 2009).*

(Continued)

*Primary Examiner* — Kamini S Shah
*Assistant Examiner* — Russ Guill
(74) *Attorney, Agent, or Firm* — Ryan, Mason & Lewis, LLP

(57) ABSTRACT

Techniques for building and implementing computing systems with simulated hardware infrastructures are provided to support, for example, development and testing of management and orchestration software. For example, a system includes a processing platform comprising hardware resources, and a simulated computing system executing on top of the processing platform using the hardware resources. The simulated computing system comprises simulated elements including a simulated compute node, a simulated network switch device, and a simulated power distribution device. The simulated compute node comprises a simulated hardware processor and a simulated storage device. The system further comprises a test control interface configured to enable a user to test the simulated computing system by injecting an error into the simulated computing system. For (Continued)

example, error injection includes manipulating a behavior of one or more of the simulated elements and/or simulating a failure of one or more of the simulated elements.

20 Claims, 7 Drawing Sheets

(56) References Cited

U.S. PATENT DOCUMENTS

| | | | | |
|---|---|---|---|---|
| 2014/0289570 | A1* | 9/2014 | Lewis | G06F 11/3089 714/43 |
| 2015/0222515 | A1* | 8/2015 | Mimura | H04L 43/0876 709/224 |
| 2015/0326535 | A1* | 11/2015 | Rao | H04L 41/5054 726/15 |
| 2015/0363240 | A1* | 12/2015 | Koizumi | G06F 9/5061 718/1 |
| 2017/0078216 | A1* | 3/2017 | Adolph | H04L 12/4641 |

OTHER PUBLICATIONS

M. Stetter et al., "IBM eServer z990 improvements in firmware simulation," 2004, IBM Journal of Research and Development, vol. 48, No. 3/4, pp. 583-594 (Year: 2004).*

Marian Friedman et al., "IBM Data Center Networking Planning for Virtualization and Cloud Computing," 2011, International Business Machines Corporation, 260 pages (Year: 2011).*

"An SDN-based network simulator with openflow-enabled switches," Mar. 2015, EstiNet, 1 page (Year: 2015).*

"Virtual Machine Guide VMware Server 1.0," 2006, VMware Inc., 286 pages (Year: 2006).*

"Isilon OneFS Simulator Installation Guide," Dec. 2015, EMC Corporation, 16 pages (Year: 2015).*

Jakob Engblom et al., "Testing embedded software using simulated hardware," 2006, Embedded Real Time Systems 2006, 9 pages (Year: 2006).*

D. Cotroneo et al., "Network Function Virtualization: Challenges and Directions for Reliability Assurance," 2014, 2014 IEEE International Symposium on Software Reliability Engineering Workshops, 6 pages (Year: 2014).*

* cited by examiner

10

COMPUTING SYSTEM WITH SIMULATED HARDWARE INFRASTRUCTURE TO SUPPORT DEVELOPMENT AND TESTING OF MANAGEMENT AND ORCHESTRATION SOFTWARE

FIELD

The field relates generally to computing systems and, more particularly, to techniques for managing computing systems such as datacenters.

BACKGROUND

Various private/public entities such as service providers and enterprise organizations deploy large-scale distributed computing systems with data processing and storage functionality to support network applications and/or on-line services. For example, complex datacenters and cloud computing platforms are typically implemented using a large number of computing resources, including, for example, a combination of physical and virtual compute, network and storage resources. As these computing systems must be continually scaled to meet increased user demand, a computing infrastructure which enables rapid and cost effective scaling of computing resources should be implemented to meet such increased demand. One type of computing infrastructure that is becoming increasingly utilized to implement large-scale computing systems (such as datacenters) is a "converged infrastructure". A converged infrastructure integrates compute, network and storage into a single integrated platform.

As new computing platform models are developed to enable scaling of distributed computing, the ability of management and orchestration software to effectively manage a large-scale distributed computing system having a large number of compute nodes, storage nodes, switch nodes, and power nodes, for example, becomes increasingly problematic. Indeed, since a datacenter can be implemented with thousands of compute nodes, techniques are needed to ensure that the functionalities (e.g., discovery, provisioning, system health monitoring, telemetry, etc.) provided by management and orchestration software work properly and efficiently. For example, if some compute nodes in a given large-scale computing system either fail or shutdown accidently, one must ensure that these exceptions can be properly handled by the management and orchestration software or other failure recovery logic.

SUMMARY

Embodiments of the invention provide systems and methods for building and implementing computing systems with simulated hardware infrastructures to, e.g., support development and testing of management and orchestration software.

For example, one embodiment includes a system, wherein the system comprises a processing platform comprising hardware resources, and a simulated computing system executing on top of the processing platform using the hardware resources. The simulated computing system comprises a plurality of simulated elements. The simulated elements comprise a simulated compute node, a simulated network switch device, and a simulated power distribution device. The simulated compute node comprises a simulated hardware processor and a simulated storage device. The system further comprises a test control interface configured to enable a user to test the simulated computing system by injecting an error into the simulated computing system. For example, error injection includes manipulating a behavior of one or more of the simulated elements and/or simulating a failure of one or more of the simulated elements.

Another embodiment includes an article of manufacture comprising a processor-readable storage medium having encoded therein executable code of one or more software programs, wherein the one or more software programs when executed by one or more processing devices implement a simulated computing system. The processor-readable storage medium comprises executable code to (i) generate a plurality of simulated elements of a simulated computing system, the simulated elements comprising a simulated compute node, a simulated network switch device, and a simulated power distribution device, the simulated compute node comprising a simulated hardware processor and a simulated storage device, (ii) generate a test control interface configured to enable a user to test the simulated computing system by injecting an error into the simulated computing system, wherein executable code for injecting an error comprises executable code for at least one of manipulating a behavior of one or more of the simulated elements and simulating a failure of one or more of the simulated elements, and (iii) deploying the simulated computing system on a processing platform comprising hardware resources for executing the simulated computing system.

Other embodiments will be described in the following detailed description, which is to be read in conjunction with the accompanying drawings.

DETAILED DESCRIPTION

Illustrative embodiments will now be described in further detail with regard to systems and methods for building, deploying, and testing a simulated computing system (e.g., a datacenter) comprising a simulated hardware infrastructure. Embodiments of the invention provide cost-effective techniques for building simulated computing systems with simulated hardware infrastructures that can be readily scaled and modified for various purposes, including, for example, pre-deployment resiliency testing and/or validation of computing system designs, and providing a simulated computing system environment for the development and testing of management and orchestration software, etc. Systems and methods for building, deploying, and testing simulated computing systems are schematically illustrated in the accompanying drawings, wherein the same or similar reference numbers as used throughout the drawings are meant to denote the same or similar features, elements, or structures. In this regard, a detailed explanation of the same or similar features, elements, or structures will not be repeated for each of the drawings.

Figure 1:
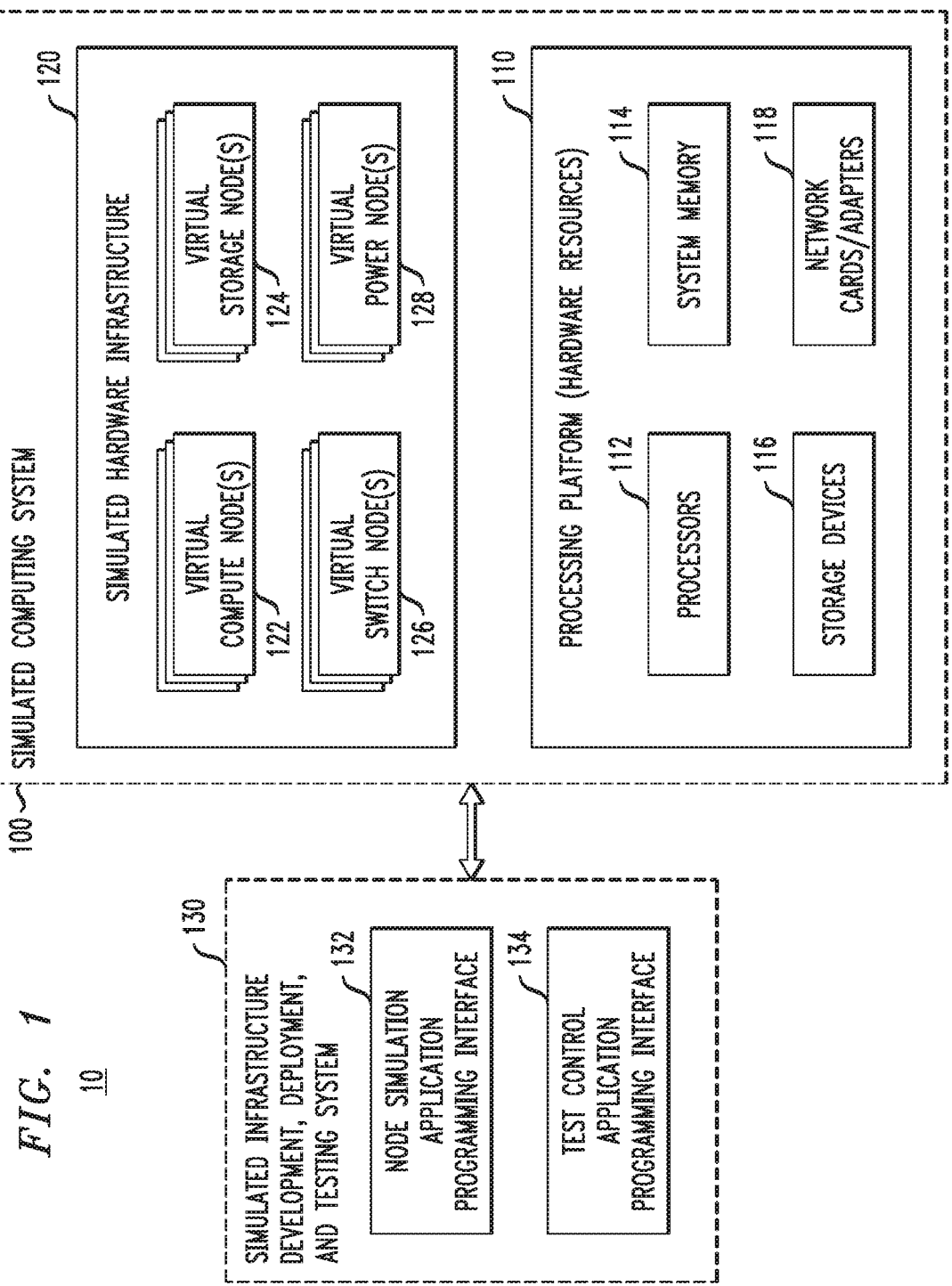
FIG. 1 is a high-level schematic illustration of a system for developing and testing a simulated computing system, according to an embodiment of the invention.

FIG. 1 is a high-level schematic illustration of a system for developing and testing a simulated computing system, according to an embodiment of the invention. In particular, FIG. 1 illustrates a simulation and test environment 10 for developing, deploying, and testing a simulated computing system 100. The simulated computing system 100 comprises a processing platform 110 and a simulated hardware infrastructure 120. The processing platform 110 comprises a plurality of hardware resources including, for example, processors 112, system memory 114 (e.g., system RAM), storage devices 116 (e.g., persistent storage), and network cards/adaptors 118. The simulated hardware infrastructure 120 comprises a plurality of simulated elements 122, 124, 126, and 128. The simulated hardware infrastructure 120 comprises a simulated computing system infrastructure which executes on top of the processing platform 110 using the hardware resources 112/114/116/118.

As shown in FIG. 1, the simulated elements comprise virtual compute nodes 122, virtual storage nodes 124, virtual switch nodes 126, and virtual power nodes 128. The virtual compute nodes 122 comprise simulated server nodes having associated simulated hardware (e.g., simulated hardware processors, simulated memory devices (e.g., DRAM), etc. The virtual storage nodes 124 comprise simulated persistent storage devices (e.g., HDDs (hard disk drives), SSDs (solid state drives), etc.). The virtual switch nodes 126 comprises simulated switch devices that are configured to implement simulated network topologies. The virtual power nodes 128 comprise simulated power supply nodes and simulated power distribution units (PDUs) that supply/distribute power to the various simulated elements of the simulated hardware infrastructure 120.

The simulation and test environment 10 further comprises a simulated infrastructure development, deployment, and testing system 130. The system 130 comprises application programming interfaces that are configured to enable a user to design, deploy, and test the simulated computing system 100. In one embodiment, the application programming interfaces comprises web-based interfaces. For example, as shown in FIG. 1, the system 130 comprises a node simulation API 132, and a test control API 134. The node simulation API 132 implements user interfaces and methods that are configured to (i) define/build simulated hardware elements including, but not limited to, servers, storage elements, network devices, and power control elements, (ii) utilize the simulated hardware elements to build different types of customized simulated nodes (e.g., virtual compute nodes 122, virtual storage nodes 124, virtual switch nodes 126, virtual power nodes 128), (iii) utilize the simulated nodes to build simulated scalable, heterogeneous hardware infrastructures and associated simulated network topologies; and (iv) enable on-demand deployment of a simulated hardware infrastructure on top of one or more actual servers (e.g., processing platform 110) to implement a simulated computing system.

In one embodiment of the invention, the node simulation API 132 comprises methods that allow a user to define/build simulated hardware elements with the same or similar properties and functionalities as commercially available vendor-specific hardware components. This allows a user to define/build customized simulated nodes (e.g., virtual compute nodes 122, virtual storage nodes 124, virtual switch nodes 126, virtual power nodes 128) that emulate vendor-specific components such as vendor-specific servers, storage elements, network devices, and power control devices. In this regard, a simulated computing system can be implemented using a simulated hardware infrastructure that emulates an actual hardware infrastructure comprising vendor-specific servers, storage elements, network devices, and power control devices of one or more different vendors.

The test control API 134 implements user interfaces and methods that are configured to perform resiliency testing and/or validation of a simulated computing system. For example, a simulated computing system can be implemented with a simulated hardware infrastructure that is designed to support a given network-based application. The functionality/operation of the simulated hardware infrastructure can be validated by executing the network-based application on top of the simulated hardware infrastructure. In addition, resiliency testing or failure recovery testing of the simulated computing system and/or an application executing on the simulated computing system can be performed by injecting errors into the simulated computing system 100 via the test control API 134.

By way of example, the system 130 can be utilized to test (via the test control API 134) the operation and functionality of a management and orchestration software platform (which is being developed) by executing the management and orchestration software platform on top of a simulated computing system infrastructure. With this process, the simulated computing system infrastructure is designed to emulate an actual computing system for which the management and orchestration platform is being developed. This allows the software developer to test the functionality of the management and orchestration platform for a target computing system design, while not actually have to build a physical prototype of the computing system for purposes of testing the software. In general, a management and orchestration platform is a software system that can be deployed with a computing system to automate various functions such as instantiating, provisioning, managing and/or controlling various resources (e.g., compute, storage, and network resources) of the computing system. In addition, a management and orchestration platform can be configured to monitor various services and functionalities of the computing system and automatically perform failure recovery operations in the event that system failures (e.g., service failures, hardware failures, etc.) are detected.

In this regard, in one embodiment of the invention, a management and orchestration platform can be deployed to execute on top of the simulated computing system, wherein the test control API 134 allows a user to test a functionality of the management and orchestration platform by, e.g., injecting error into the simulated computing system, and determining how the management and orchestration platform reacts in response to the injected error. For example, the test control API 134 can be utilized to manipulate/change a behavior of one or more of the simulated elements, or simulate a failure of one or more of the simulated elements of the simulated computing system. In particular, the test control API 134 can be utilized to modify system behavior by manipulating FW (firmware) behavior of one or more simulated hardware elements or simulated nodes, or simulating a hardware failure of one or more simulated hardware elements. For example, the test control API 134 can be used to change a server node boot sequence, or re-direct BMC (baseboard management control) traffic to a shared or separate NIC (network interface card). Further, the test control API 134 can be utilized to inject errors that emulate hardware failures such as processor overheat, hard drive faults, etc. Illustrative embodiments of test control interfaces and functionalities will be described in further detail below.

While FIG. 1 illustrates a high-level framework of a simulated computing system 100, it is to be understood that the simulated infrastructure, development, and testing system 130 is configured to allow a user to build a myriad of different types of simulated computing systems with customized simulated hardware infrastructures. It is to be understood that the term "computing system" as used herein is intended to be broadly construed so as to encompass, for example, any system comprising multiple networked processing devices such as a datacenter, cloud computing system, or enterprise network, etc. A simulated computing system according to an embodiment of the invention may comprise a simulated "data storage system" wherein the term data storage system denotes an application that executes on a simulated computing system to implement a storage system, or combination of storage systems, including, but not limited to, storage area network (SAN) systems, network attached storage (NAS) systems, Hadoop Distributed File System (HDFS), as well as other types of data storage systems comprising clustered or distributed virtual and/or physical infrastructure.

Furthermore, a simulated computing system according to an embodiment of the invention may comprise various types of simulated "storage devices" such as such persistent storage devices including HDD devices, flash storage devices (e.g., PCIe flash cards), SSD devices, or other types and combinations of non-volatile memory, such as external DAS (direct attached storage) devices that can be coupled to server nodes using suitable interfaces (e.g., SCSI, SATA or SAS interfaces). The term "memory" or "system memory" as used herein refers to volatile and/or non-volatile memory which is used by an application to temporarily store data during processing.

In addition, a simulated computing system according to an embodiment of the invention may be implemented using various types of simulated processors. The term "processor" as used herein is intended to be broadly construed so as to include any type of processor that performs processing functions based on software, hardware, firmware, etc. For example, a "processor" is broadly construed so as to encompass all types of hardware processors including, for example, (i) general purpose processors which comprise "performance cores" (e.g., low latency cores), and (ii) workload-optimized processors, which comprise any possible combination of multiple "throughput cores" and/or multiple hardware-based accelerators. Examples of workload-optimized processors include, for example, graphics processing units (GPUs), digital signal processors (DSPs), system-on-chip (SoC), application-specific integrated circuits (ASICs), and field programmable gate array (FPGAs), and other types of specialized processors or coprocessors that are configured to execute one or more fixed functions. By way of further example, a processor may be a GPGPU (general purpose computing on graphics processing unit) processor device. The term "hardware accelerator" broadly refers to any hardware that performs "hardware acceleration" to perform certain functions faster and more efficient, than is possible for executing such functions in software running on a more general purpose processor.

Figure 2:
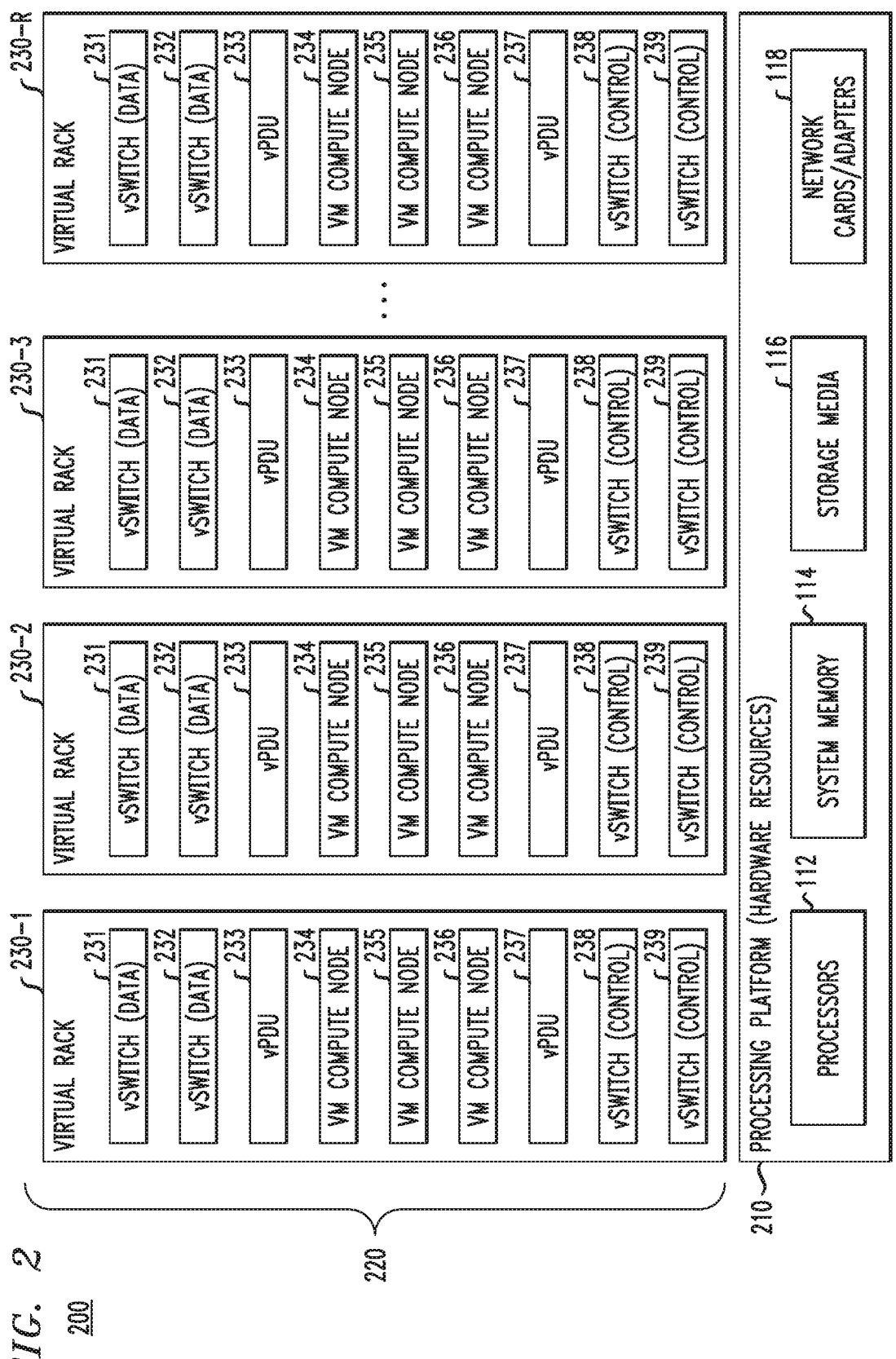
FIG. 2 schematically illustrates a simulated computing system, according to an embodiment of the invention.

FIG. 2 schematically illustrates a simulated computing system, according to an embodiment of the invention. In particular, FIG. 2 schematically illustrates a simulated computing system 200 comprising a processing platform 210 and a simulated hardware infrastructure 220 which executes on top of the processing platform 210. The processing platform 210 comprises a plurality of hardware resources 112, 114, 116, and 118, similar to the processing platform 110 discussed above with reference to FIG. 1. The simulated computing system 200 of FIG. 2 provides an example embodiment of a simulated datacenter, wherein the simulated hardware infrastructure 220 comprises a plurality of simulated hardware elements including, for example, simulated rack elements 230-1, 230-2, 230-3, . . . , 230-R (collectively referred to as simulated rack elements 230 or virtual racks 230). In the example embodiment of FIG. 2, each of the simulated rack elements 230 represents/emulates a physical datacenter rack system which houses various hardware elements such as servers, networking devices, power distribution units, cables, and other types of computing hardware/equipment that is typically included in datacenter racks within a datacenter facility.

In particular, as further shown in FIG. 2, each of the simulated rack elements 230 comprises a plurality of simulated hardware elements 231, 232, 233, 234, 235, 236, 237, 238, and 239, which include virtual switches 231/232/238/239, virtual power distribution units (PDUs) 233/237, and virtual compute nodes 234/235/236, which are arranged in stacked configuration as shown. The virtual switches 231/232/238/239 (alternatively referred to herein as virtual switch nodes or virtual switch devices) comprise virtual switches 231 and 232 that are configured to simulate an in-band data network topology of the simulated computing system 200, as well as virtual switches 238 and 239 that are configured to simulate an out-of-band control network topology of the simulated computing system 200. The virtual PDUs 233 and 237 (alternatively referred to herein as virtual power distribution nodes or virtual power distribution devices) are configured to emulate, e.g., power supply control and power distribution functionality in the simulated computing system 200.

Further, the virtual compute nodes 234, 235, 236 are configured to emulate server compute nodes with user-defined hardware properties and functionalities. Each virtual compute node 234, 235, 236 comprises one or more simulated hardware processors, simulated memory, and simulated storage devices, which can be defined, for example, to emulate the functionalities and properties of vendor-specific hardware components/products. Various alternative architectures to implement virtual compute nodes using, e.g. virtual machines, in a simulated computing system according to embodiments of the invention will be discussed in further detail below with reference to, e.g., FIGS. 3 and 4.

The simulated hardware infrastructure 220 of FIG. 2 can be designed by defining a plurality of simulated hardware elements (simulated switches, simulated compute nodes, simulated PDUs), and reusing the simulated hardware components to build a simulated rack element. For example, the virtual compute nodes 234/236/238 may be the same simulated compute node, which is defined/built via the node simulation API 132 (FIG. 1), and then reused multiple times to build the virtual rack 230-1. Further, the virtual PDUs 233/237 may be the same simulated power control node, which is defined/built via the node simulation API 132, and then reused multiple times to build the virtual rack 230-1. Similarly, the virtual switches 231/232/238/239 may be the same simulated switch element, which is defined/built via the node simulation API 132, and then reused multiple times to build the virtual rack 230-1. In addition, the node simulation API 132 is utilized to define a simulated network topology to connect the constituent simulated elements within the virtual rack 230-1 using the virtual switches 231, 232, 238, and 239.

Moreover, the virtual rack 230-1 may be a simulated element, which is defined/built via the node simulation API 132, and then reused multiple times in the simulated hardware infrastructure 200 to implement the other virtual racks 230-2, 230-3, . . . , 230-R. In addition, the node simulation API 132 is utilized to define a simulated network topology to connect the virtual racks 230 using the virtual switches 231, 232, 238, and 239 within the virtual racks 230. In this regard, by reusing simulated elements, the simulated hardware infrastructure 220 can be readily scaled up by, e.g., adding simulated hardware components to one or more simulated racks 230, or otherwise or scaled-out by, e.g., adding more simulated rack elements to the simulated hardware infrastructure 220.

Figure 3:
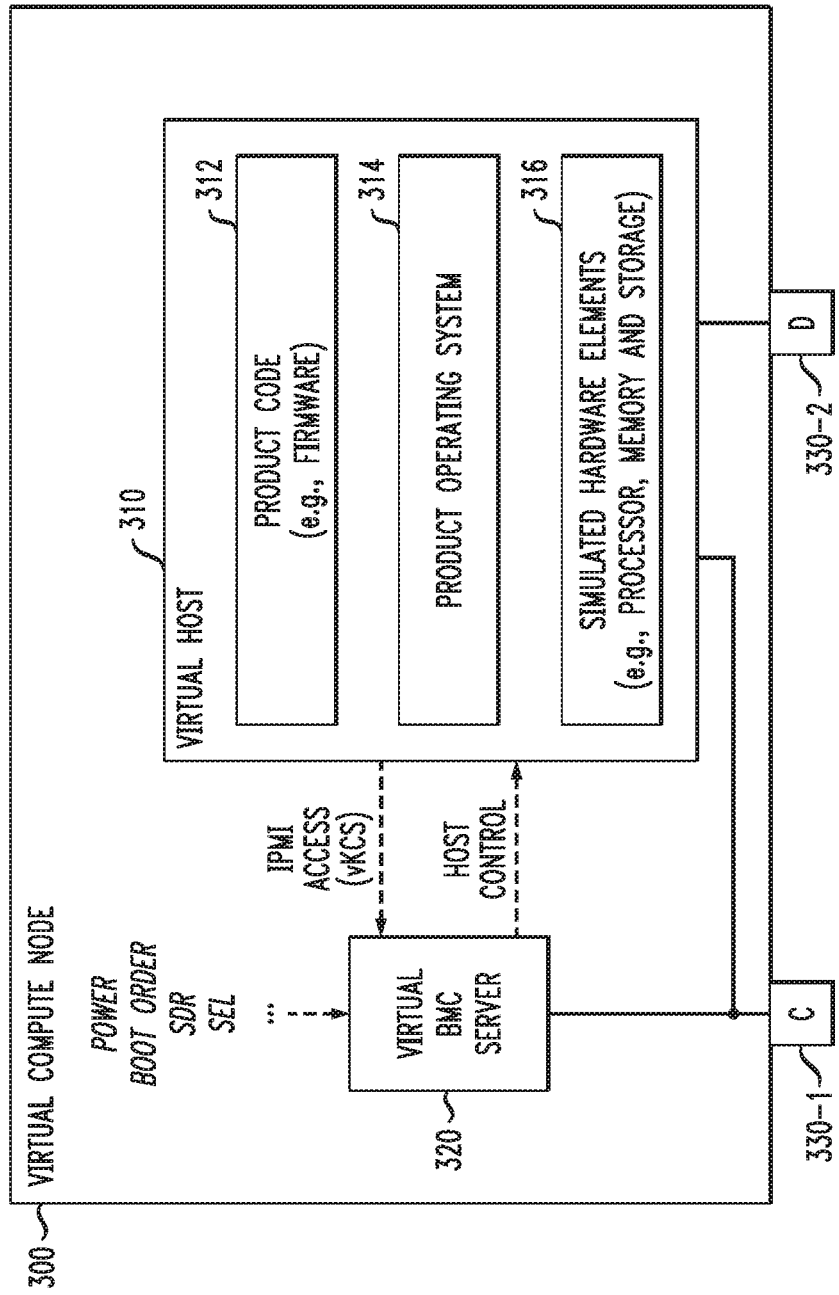
FIG. 3 schematically illustrates a virtual compute node according to an embodiment of the invention.

FIG. 3 schematically illustrates a virtual compute node 300 according to an embodiment of the invention. The virtual compute node 300 comprises a virtual host 310, product code 312, a product operating system 314, simulated hardware elements 316, a virtual BMC (baseboard management controller) server 320, a control port 330-1 and a data port 330-2. The virtual compute node 300 is configured to simulate a physical compute node (e.g., server node), which typically includes a BMC server, one or more processors (e.g., CPUs), system memory (e.g., DRAM), storage devices (e.g., HDD), and network adaptors (e.g., NIC, HBA). The control port 330-1 comprises a simulated network interface element that is configured to connect the virtual compute node 300 to a simulated out-of-band control network, for example. The data port 330-2 comprises a simulated network interface element that is configured to connect the virtual compute node 300 to a simulated in-band data network, for example.

In one embodiment of the invention, the virtual host 310 is implemented using a hosted virtual machine monitor system, such as the open source hosted hypervisor system QEMU (Quick Emulator). The virtual host 310 hosts the product code 312 and operating system 314, which execute on the virtual compute node 300. The product code 312 comprises firmware (e.g. BIOS (Basic Input/Output System) or UEFI (Unified Extensible Firmware Interface)) and other application code that is executed on the virtual compute node 300 to implement data plane or control plane functions for a given simulated computing system environment. In one embodiment, the product code 312 further comprises SMBIOS (System Management BIOS) data structures (e.g., data tables) which describe a configuration of the virtual compute node 300 (e.g., description of the simulated hardware elements). The simulated SMBIOS data includes information such as vendor name, BIOS version, installed components, CPU clock speed, etc. and other information that enables a system administrator or an operating system to determine a configuration of the simulated hardware components of the given virtual compute node 300. The virtual host 310 supports methods/interfaces to access the simulated SMBIOS data.

The virtual host 310 provides the operating system 314 with a simulated hardware operating platform comprising the simulated hardware elements 316, and manages the execution of the operating system 314 via the simulated hardware elements 316. The simulated hardware elements 316 include, for example, simulated processors (e.g., CPUs), simulated data memory elements (e.g., DRAM, DIMM), simulated storage elements (e.g., flash NAND storage, SSD, HDD, etc.), and simulated network interfaces (e.g., NIC, HBA). As noted above, the node simulation API 132 (FIG. 1) provides an interface to define/build simulated hardware elements and utilize the simulated hardware elements to generate a custom virtual compute node (e.g., virtual compute node 300 as shown in FIG. 3).

In this regard, the properties of each simulated component of the virtual compute node 300 can be configured through the node simulation API 132. For example, with regard to the simulated hardware elements 316, a user can define the number of simulated hardware processors, and the properties and functionalities of the simulated hardware processors (e.g., number of sockets, number of cores, family, model, memory configuration). In addition, the user can specify the number, properties and functionalities of simulated DIMMS, drives, and network cards (size, vendor type, serial number, etc.). The virtual compute node 300 can be configured to emulate a low-end server or a high-end server depending on the number and configuration of the simulated hardware elements 316.

Moreover, as noted above, the product code 312, product operating system 314, and simulated hardware elements 316 can be custom designed with vendor-specific personalities and vendor specific functionality to emulate commercially available vendor-specific products. Moreover, the SMBIOS data simulation enables the virtual compute node 300 to present identification information, and SKU information, for example, in the same manner as what an actual vendor-specific compute node would provide. In this aspect, any software interrogating the virtual compute node 300 would treat the virtual compute node 300 as a physical node.

The virtual BMC server 320 is configured to emulate the functionalities of an actual BMC server. In one embodiment, the virtual BMC server 320 is configured to work in conjunction with the test control API 134 to introduce errors into a simulated computing system for purposes resiliency testing, failure recovery, and/or validation of a given simulated system design or management and orchestration software. A BMC comprises a service processor that is configured to monitor the physical state of a computer, or hardware devices, using a plurality of sensors. The sensors monitor and measure various variables/parameters/statistics such as physical variables (e.g., temperature, power-supply voltage, cooling fan speeds), processor status, power supply status, network communications parameters, and operating system functions. A BMC typically provides an interface to notify a system administrator of a problem condition, and communicate with the system administrator through an independent connection. A BMC is implemented as part of an IPMI (Intelligent Platform Management Interface) platform, which defines a set of interfaces for out-of-band management and monitoring of computer systems.

In one embodiment of the invention, the virtual BMC server 320 is used to control and monitor the virtual host 310. The virtual BMC server 320 binds to the virtual host 310 using a suitable platform (e.g., VMware virtual machine, Docker, etc.), wherein the services of the virtual BMC server 320 are executed in a container. In one embodiment of the invention, the virtual host 310 can access the virtual BMC server 320 via a messaging interface, e.g., a virtual keyboard controller style (vKCS) interface. The virtual BMC server 320 receives and processes various types of commands and data from the test control API 134 for purposes of, e.g., controlling/testing/validating the operation of virtual compute node 300 and for introducing simulated errors into the simulated computing system in which the virtual compute node 300 resides.

For example, the test control API 134 can be utilized to input chassis power control commands to the virtual BMC server 320 to simulate power on/off/reset of the virtual compute node 300. In addition, boot commands can be input to the virtual BMC server 320 to change a boot sequence of simulated compute nodes, or otherwise set different options for booting operations. Other control commands can be input to the virtual BMC server 320 via the test control API 134 to, e.g., change firmware behavior(s), change operating system behavior(s), change the configuration of one or more of the simulated hardware elements 316 (e.g., changing BIOS configuration of a virtual compute node, change port configuration of a simulated network switch), etc. These changes allow a user to test error recovery logic or to validate the robustness of a high-availability computing scheme that is emulated by the simulated computing system being tested.

By way example, in a large scale computing system infrastructure, there are a multitude of factors/dependencies that must be taken into consideration for provisioning nodes, e.g., IO devices (NICs, device drivers), storage configuration (RAID or SATA, or SAS), firmware configurations, etc., in order to be able to successfully install and boot an operating system or hypervisor. The test control API 134 in conjunction with the virtual BMC server 320 allows a user to emulate a variety of different hardware/firmware configurations of the virtual nodes (e.g., virtual compute nodes, virtual switches, virtual storage nodes, etc.) to test node provisioning operations, for example, in the simulated computing system. Moreover, in another embodiment, SOL (serial over LAN) features of the virtual BMC server 320 can be utilized in conjunction with the test control API to redirect a serial output data stream through a simulated network of the simulated computing system, thereby changing a behavior of the system (e.g., re-direct BMC traffic to a shared or separate NIC interface).

Furthermore, the test control API 134 can be utilized to inject error conditions into the simulated computing system by, e.g., generating and inputting SDR (sensor data reading) data (alternatively referred to as telemetry data) and/or SEL (system event log) data into the virtual BMC server 320, wherein the SDR data and SEL data includes information that is recognized by the virtual BMC controller 320 as being indicative of one or more "error" condition (e.g., hardware failures). In particular, telemetry data (sensor readings) provides various types of information regarding temperature, power consumption, component presence, network thought-put and health status, of the system being monitored. The test control API 134 allows a user to manipulate/change the telemetry data (e.g., simulating dynamically changing fan, voltage, current, and temperature sensor readings) to introduce one or more errors into the simulated computing system for purposes of testing the error recovery logic or management and orchestration system associated with the simulated computing system.

For example, in a computing system, a software feature can be implemented to automatically migrate a heavy-loaded virtual machine, if the server node hosting the virtual machine is determined to be consuming too much power. To simulate an error condition of high-power usage (and initiate a virtual machine migration process), the power consumption telemetry data of a given virtual compute node can be increased to simulate that an upper limitation of computing power (and maximum power consumption) has been reached/exceeded by the given virtual compute node, and thereby test the virtual machine migration functionality of the system (e.g., operation of management and orchestration software) in response to the simulated telemetry data.

In another embodiment, hardware failures can be simulated by error injection through modification of SDR data or SEL data. For example, certain SDR data can modified to indicate a broken or non-functioning simulated hardware component, for example. In addition, an error event can be included in SEL data to indicate a failure event of a simulated hardware component. An SEL typically includes various event and status information such as power information, component status, fan performance, and other information provided by a given computing resource. Various types of SEL data can be modified to simulate various types of error conditions indicative of hardware failures (e.g., processor overheat, drive fault, etc.).

Figure 4:
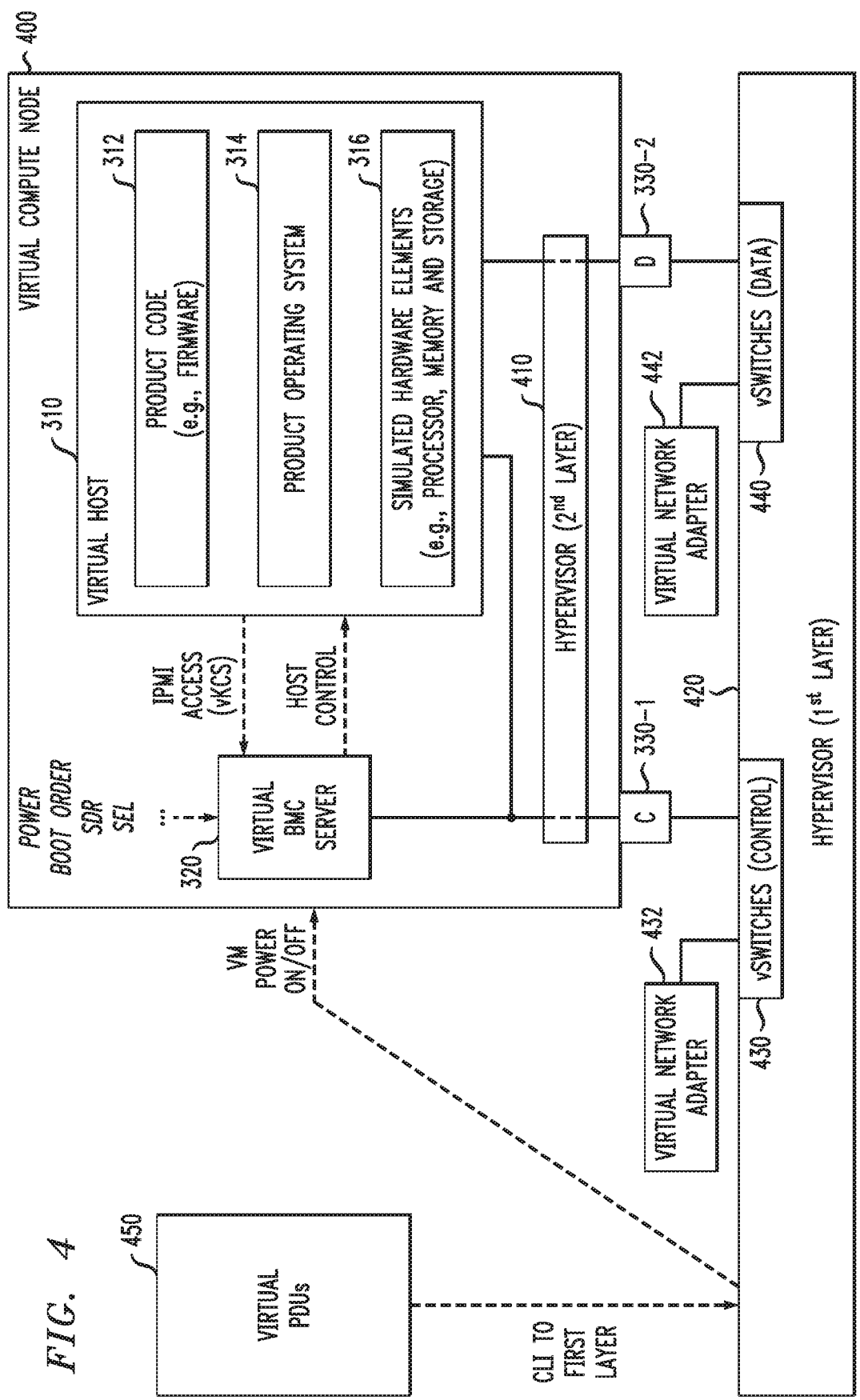
FIG. 4 schematically illustrates a virtual compute node according to another embodiment of the invention.

FIG. 4 schematically illustrates a virtual computing node according to another embodiment of the invention. More specifically, FIG. 4 schematically illustrates a virtual computing node 400 having an architecture that is implemented based on a hypervisor platform. The virtual compute node 400 is an embodiment of the virtual compute node 300 of FIG. 3, which is implemented using hypervisor platforms 410 and 420. A first layer hypervisor 420 is provided, wherein various components (e.g., virtual compute nodes, virtual PDUs, virtual switches) of the simulated hardware infrastructure are built and operated on top of the first$^t$ layer hypervisor 420. In one embodiment of the invention, the first layer hypervisor 420 comprises what is referred to as "type-1, bare-metal hypervisor" which executes directly on the hardware platform of a given host to (i) control the host hardware and (ii) manage and control a simulated hardware infrastructure of a simulated computing system which executes on top of the first layer hypervisor 420. In one embodiment, the first level hypervisor 420 is implemented using the commercially available VMware ESXi type-1 hypervisor platform (developed by VMWare Inc. of Palo Alto, Calif.). The type-1 hypervisor 420 comprises and integrates core operating system components (i.e., does not run on a host operating system).

On the other hand, the second layer hypervisor 410 comprises what is referred to as a "type-2 hypervisor," which comprises a hosted hypervisor system that executes on top of the first layer hypervisor 420. The second layer hypervisor 410 is utilized to manage and control the virtual host 310 and virtual BMC server 320 which execute on top of the second layer hypervisor 410. The second layer hypervisor 410 is utilized to configure the properties of the virtual compute node 400 (e.g., configure and control simulated hardware elements, vendor personalities/functionalities, chassis management, etc.).

As further shown in FIG. 4, a plurality of virtual switch nodes 430 and 440 are executed and managed by the first layer hypervisor 420. In one embodiment, the virtual switch nodes are partitioned into a set of virtual switch nodes 430 that are used to implement a simulated out-of-band control network, and a set of virtual switch nodes 440 that are used to implement a simulated in-band data network. The plurality of virtual switch nodes 430 and 440 can be implemented using the ESXi vSwitch virtualization framework from VMware. A plurality of virtual network adaptors 432 and 442 are configured to execute on top of the first layer hypervisor 420, which simulate network cards (e.g., NIC). In particular, the virtual switch nodes 430 and 440 utilize physical NICs of a physical host server to connect the simulated (virtual) networks to a physical network. The virtual network adaptors 432 and 442 are utilized by the physical NICs to interface with the virtual switch nodes 430 and 440.

Moreover, FIG. 4 shows one or more virtual PDU elements 450 that execute on top of the first layer hypervisor 420. In one embodiment of the invention, the virtual PDU elements 450 interface to the first layer hypervisor 420 through a command line interface (CLI) to control power of the entire virtual compute node (e.g., turn on or turn off the virtual compete node). An example embodiment of a virtual PDU element will be discussed in further detail below with reference to FIG. 6.

Figure 5:
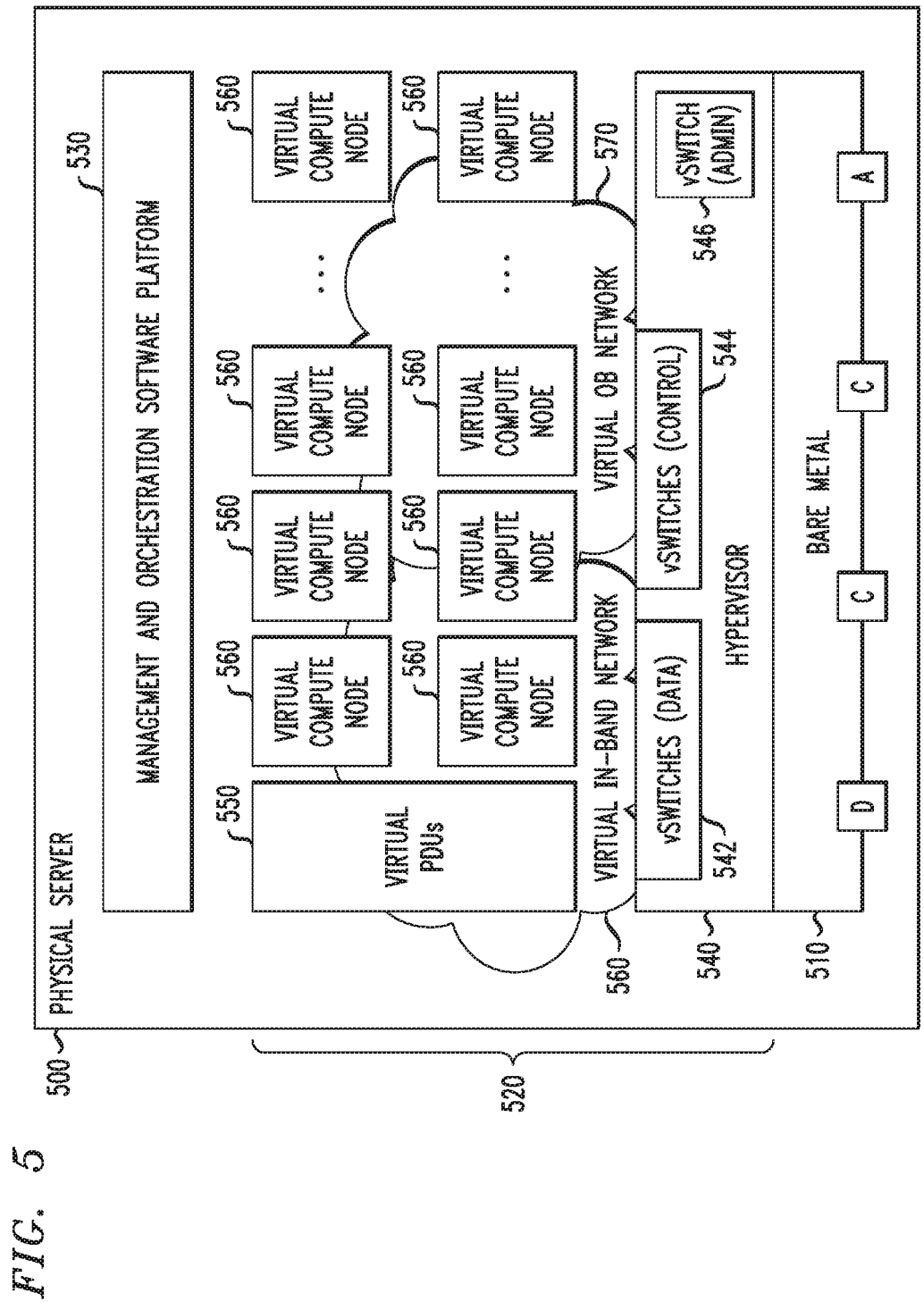
FIG. 5 schematically illustrates a simulated computing system according to another embodiment of the invention.

FIG. 5 schematically illustrates a simulated computing system according to another embodiment of the invention. In particular, FIG. 5 schematically illustrates a physical server node 500 which comprises a bare metal layer 510, a simulated hardware infrastructure 520 that executes on top of the bare metal layer 510, and a management and orchestration software platform 530 that executes on top of the simulated hardware infrastructure 520. The simulated computing infrastructure 520 comprises a bare metal hypervisor 540, a plurality of virtual switch nodes 542, 544, and 546, one or more virtual PDU elements 550, a plurality of virtual compute nodes 560, a simulated virtual in-bad data network 560, and a simulated virtual out-of-band control network 570.

In one embodiment of the invention, the simulated computing infrastructure 520 of FIG. 5 is based on the simulated computing infrastructure shown in FIG. 4. In particular, the hypervisor 540 comprises a type-1 bare metal hypervisor that executes on the bare metal hardware layer 510 of the physical server node 500. The hypervisor 540 hosts and executes the virtual switch nodes 542 to implement the simulated in-band data network 560. The hypervisor 540 hosts and executes the virtual switch nodes 544 to implement the simulated out-of-band network 570. In addition, the virtual switch node 546 comprises a dedicated simulated switch element to enable a system administrator to directly access and control various simulated elements of the simulated computing infrastructure 520. In one embodiment, the virtual compute nodes 560 are implemented using the architecture of the virtual compute node 400 shown in FIG. 4.

Moreover, as shown in FIG. 5, the bare metal layer 510 comprises network interfaces D (data), C (control), and A (administrative) to enable network connection to simulated components of the simulated computing infrastructure 520 through the bare metal layer 510. Although not specifically shown in FIG. 5, a separate simulated administrative control network may be implemented to enable, e.g., direct administrative control and management of simulated component of the simulated computing infrastructure 520.

FIG. 5 illustrates an example embodiment in which a simulated computing infrastructure 520 is implemented on top of a single instance of the hypervisor 540 executing on one physical server node 500. Because of the small footprint of a simulated computing system, hundreds of virtual compute nodes, and other simulated nodes, can be implemented on one physical server. However, to deploy a very large scale simulated computing system infrastructure, a plurality of network connected physical servers can be utilized to execute different portions of the infrastructure of a simulated computing system, as well as execute multiple instances of the hypervisor platform 540 so that the large scale simulated computing system can be deployed in a distributed manner across multiple physical servers. For example, thousands of simulated compute nodes can be deployed across small number (e.g., 16) of physical servers.

Moreover, it is to be noted that FIG. 5 illustrates an example architecture that can be implemented using virtual machines executing on a hypervisor-based system such as VMware ESXi. In another embodiment, a simulated computing system can be implemented using a container framework such as Docker. As in known in the art, Docker is an open-source project that automates the deployment of applications inside software containers, by providing an additional layer of abstraction and automation of operating-system-level virtualization on Linux. To implement a simulated computing system using a container such as Docker, a user can: (i) install a Linux OS (such as Ubuntu, Redhat, Centos, . . . ) and a Docker service on the OS instead of a Hypervisor; (ii) install a virtual switch node using, e.g., the Open vSwitch platform (open source implementation of a distributed virtual multilayer switch); and (iii) create a Docker image which contains a virtual BMC component and a virtual host component (QEMU).

Figure 6:
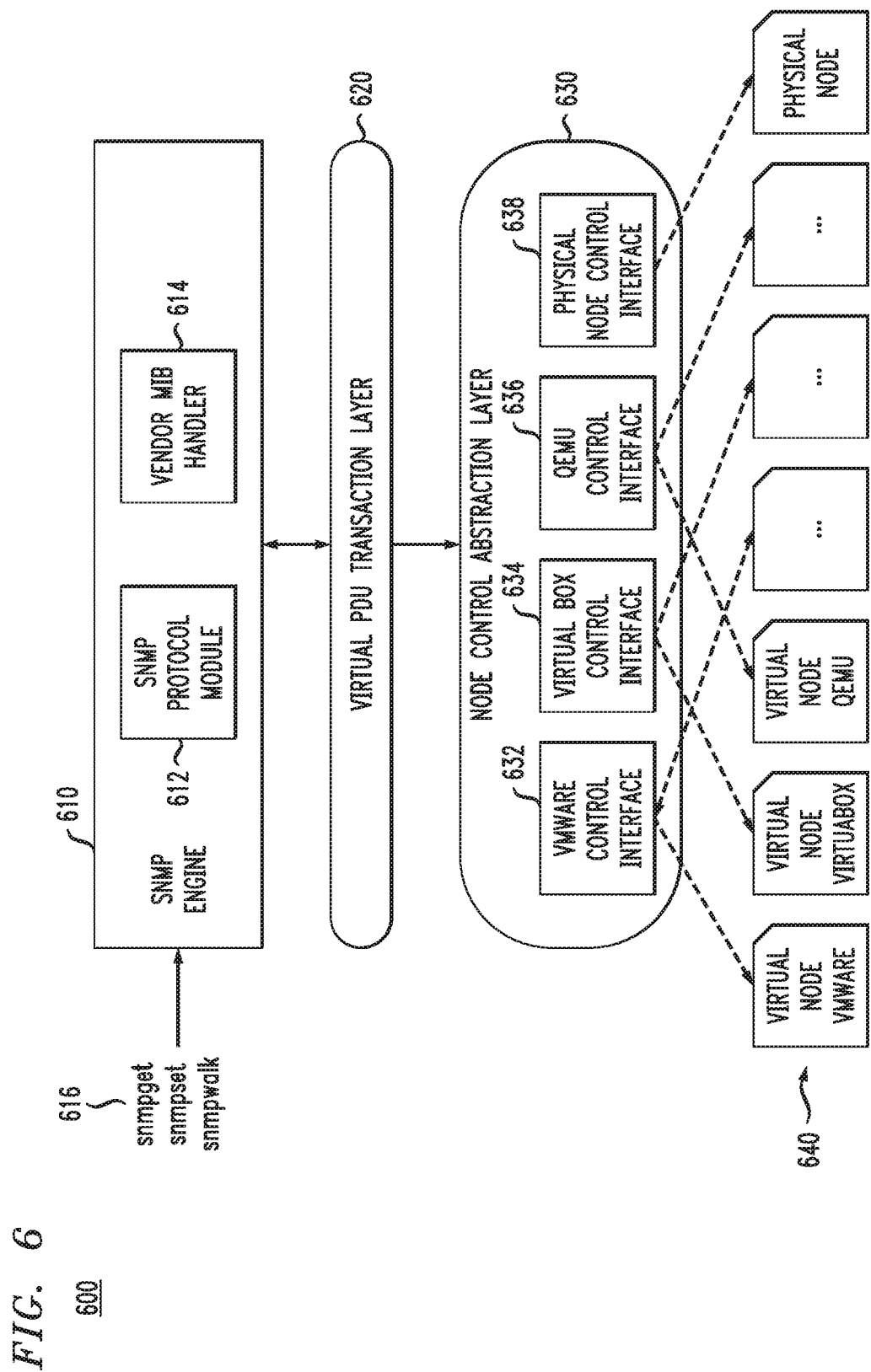
FIG. 6 schematically illustrates a virtual power distribution unit according to an embodiment of the invention.

FIG. 6 schematically illustrates a virtual power distribution unit according to an embodiment of the invention. In particular, FIG. 6 illustrates an example embodiment of a virtual PDU node 600 which is based on the Simple Network Management Protocol (SNMP). The virtual PDU node 600 comprises a SNMP engine layer 610, a virtual PDU transaction layer 620, and a node control abstraction layer 630. The SNMP engine layer 610 comprises a SNMP protocol module 612, and a vendor MIB (management information base) handler 614.

The SNMP engine layer 610 receives and processes SNMP requests 616 via the SNMP protocol module 612. The requests 616 include, for example, snmpget, snmpset, and snmpwalk commands. The snmpget and snmpwalk commands are used to retrieve management information from devices, and the snmpset command is used to modify information on a remote host (e.g., change the value of a MIB object via SNMP). The vendor MIB handler 614 is configured to access an MIB database and update MIB data in the MIB database. An MIB database is a database that is used for managing entities in a communications network.

The virtual PDU transaction layer 620 is configured to emulate a vendor-specific physical PDU and emulate the vPDU services and functionalities of a given vendor. The node control abstraction layer 630 comprises a plurality of different interfaces 632, 634, 636, and 638 that are configured to control different types of virtual/physical nodes 640 (e.g., hypervisors (VMware, Virtualbox, etc.), virtual compute nodes (e.g., QEMU), physical server nodes, etc.) that are implemented in a given simulated computing environment, according to an embodiment of the invention. The virtual PDU node 600 can be configured to perform various functions such as node power control, trap/notification, telemetry (e.g., obtain node resource usage), vendor MIB emulation, etc. Typically, a management and orchestration software platform manages a physical PDU through the SNMP protocol. In this regard, the use of the same SNMP interface to communicate with a virtual PDU node 600 in a simulated computing environment is advantageous.

Figure 7:
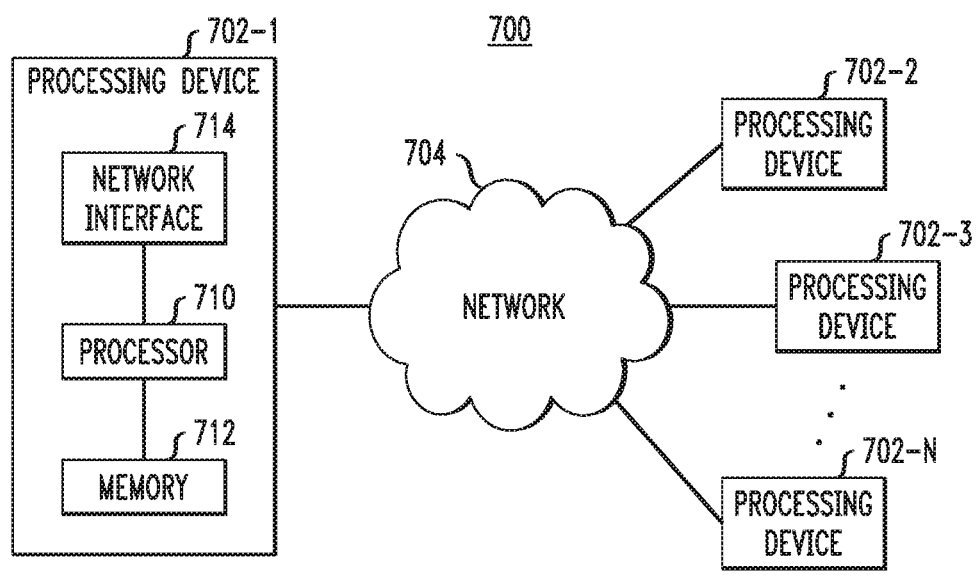
FIG. 7 schematically illustrates a processing platform on which a simulated computing system can be executed, according to an embodiment of the invention.

FIG. 7 illustrates an example processing platform on which a simulated computing system can be executed according to illustrative embodiments of the invention. The processing platform 700 in this embodiment comprises a plurality of processing devices, denoted 702-1, 702-2, 702-3, . . . 702-N, which communicate with one another over a network 704. It is to be appreciated that a simulated computing system with a simulated hardware infrastructure may be executed in one such processing device 702, or executed in a distributed manner across two or more such processing devices 702. The cloud infrastructure environment may also be executed in a distributed manner across two or more such processing devices 702. The various functionalities described herein may be executed on the same processing devices, separate processing devices, or some combination of separate and the same (overlapping) processing devices. It is to be further appreciated that a server, a client device, a computing device or any other processing platform element may be viewed as an example of what is more generally referred to herein as a "processing device." As illustrated in FIG. 7, such a device generally comprises at least one processor and an associated memory, and implements one or more functional modules for instantiating and/or controlling features of systems and methodologies described herein. Multiple elements or modules may be implemented by a single processing device in a given embodiment.

The processing device 702-1 in the processing platform 700 comprises a processor 710 coupled to a memory 712. The processor 710 may comprise a microprocessor, a microcontroller, an application-specific integrated circuit (ASIC), a field programmable gate array (FPGA) or other type of processing circuitry, as well as portions or combinations of such circuitry elements. Components of systems as disclosed herein can be implemented at least in part in the form of one or more software programs stored in memory and executed by a processor of a processing device such as processor 710. Memory 712 (or other storage device) having such program code embodied therein is an example of what is more generally referred to herein as a processor-readable storage medium. Articles of manufacture comprising such processor-readable storage media are considered embodiments of the invention. A given such article of manufacture may comprise, for example, a storage device such as a storage disk, a storage array or an integrated circuit containing memory. The term "article of manufacture" as used herein should be understood to exclude transitory, propagating signals.

Furthermore, memory 712 may comprise electronic memory such as random access memory (RAM), read-only memory (ROM) or other types of memory, in any combination. The one or more software programs when executed by a processing device such as the processing device 702-1 causes the device to perform functions associated with one or more of the components/steps of system/methodologies in FIGS. 1-6. One skilled in the art would be readily able to implement such software given the teachings provided herein. Other examples of processor-readable storage media embodying embodiments of the invention may include, for example, optical or magnetic disks.

Processing device 702-1 also includes network interface circuitry 714, which is used to interface the device with the network 704 and other system components. Such circuitry may comprise conventional transceivers of a type well known in the art.

The other processing devices 702 (702-2, 702-3, . . . 702-N) of the processing platform 700 are assumed to be configured in a manner similar to that shown for computing device 702-1 in the figure.

The processing platform 700 shown in FIG. 7 may comprise additional known components such as batch processing systems, parallel processing systems, physical machines, virtual machines, virtual switches, storage volumes, etc. Again, the particular processing platform shown in this figure is presented by way of example only, and the data valuation system and cloud infrastructure described herein may include additional or alternative processing platforms, as well as numerous distinct processing platforms in any combination.

Also, numerous other arrangements of servers, clients, computers, storage devices or other components are possible in processing platform 700. Such components can communicate with other elements of the processing platform 700 over any type of network, such as a wide area network (WAN), a local area network (LAN), a satellite network, a telephone or cable network, or various portions or combinations of these and other types of networks.

Furthermore, it is to be appreciated that the processing platform 700 of FIG. 7 can comprise virtual machines (VMs) implemented using a hypervisor. A hypervisor is an example of what is more generally referred to herein as "virtualization infrastructure." The hypervisor runs on physical infrastructure. As such, the techniques illustratively described herein can be provided in accordance with one or more cloud services. The cloud services thus run on respective ones of the virtual machines under the control of the hypervisor. Processing platform 700 may also include multiple hypervisors, each running on its own physical infrastructure. Portions of that physical infrastructure might be virtualized.

As is known, virtual machines are logical processing elements that may be instantiated on one or more physical processing elements (e.g., servers, computers, processing devices). That is, a "virtual machine" generally refers to a software implementation of a machine (i.e., a computer) that executes programs like a physical machine. Thus, different virtual machines can run different operating systems and multiple applications on the same physical computer. Virtualization is implemented by the hypervisor which is directly inserted on top of the computer hardware in order to allocate hardware resources of the physical computer dynamically and transparently. The hypervisor affords the ability for multiple operating systems to run concurrently on a single physical computer and share hardware resources with each other.

An example of a commercially available hypervisor platform that may be used to implement portions of the processing platform 700 in one or more embodiments of the invention is the VMware vSphere (VMware Inc. of Palo Alto, Calif.) which may have an associated virtual infrastructure management system such as the VMware vCenter. The underlying physical infrastructure may comprise one or more distributed processing platforms that include storage products such as VNX and Symmetrix VMAX (both available from EMC Corporation of Hopkinton, Mass.). A variety of other computing and storage products may be utilized to implement the one or more cloud services that provide the functionality and features described herein.

It is to be appreciated that embodiments of the invention as discussed herein provide cost-effective techniques for building simulated computing systems with simulated hardware infrastructures that can be readily scaled and modified for various purposes, including, for example, pre-deployment resiliency testing and/or validation of computing system designs, and providing a simulated computing system environment for the development and testing of management and orchestration software, etc. The simulation and testing systems and methods as described herein enable a system/software developer to build and simulate a large scale, simulated heterogeneous infrastructure with simulated hardware components that are configured to emulate various types of vendor specific products. Advantageously, the use of a large scale simulated computing system provides a cost effective and efficient way to develop and test management and orchestration software for a computing system, wherein building a physical prototype implementation of the computing system to test the management and orchestration software would not be efficient in terms of cost, time and flexibility (as compared to emulating the computing system via simulated hardware components).

Indeed, the use of bare metal solution to build prototype computing systems for purposes of validation and developing/testing a management and orchestration system would be expensive in terms of the monetary costs associated with having to purchase a large number of hardware components from different vendors to build a large scale physical system infrastructure. Moreover, different types of the same hardware components would most likely need to be purchased so that different combinations of configurations and topologies of a physical system infrastructure can be built and tested. In this regard, a bare metal solution would be time inefficient due to, e.g., purchasing lead time for the requisite hardware components, shipping, and the time needed to manually set up the physical infrastructure. Moreover, a bare metal solution does not provide a flexible solution, since the physical hardware/firmware components are not readily or fully customizable, and have fixed behaviors. As such, a reconfiguration of the physical computing environment would require manually changing hardware/firmware components, for example.

An alternative to a bare-metal solution would be to use conventional virtualization technologies to, e.g., spawn virtual machines for purposes of scaling and adding computing power (as opposed to adding more physical compute server nodes). However, such virtualization technologies are not designed to precisely simulate various properties and functions of hardware components. As such, conventional virtualization methods cannot be effectively or directly utilized for testing/validation management and orchestration software, because such testing/validation depends significantly on specific hardware properties. Indeed, a generic virtual machine is designed to provide only computing power, and does not support the simulation of server and switch management interfaces. Moreover, existing virtualization technologies do not allow for the custom design of simulated hardware components with vendor-specific personalities and functionalities.

In contrast, the hardware infrastructure simulation and testing systems and methods discussed herein according to embodiments of the invention allow developers to construct a large, scalable simulated heterogeneous hardware infrastructure which not only can simulate an IT datacenter with thousands of servers, but also provide interfaces to control/manage the simulated hardware components of the simulated infrastructure, and to inject errors into the simulated computing system to simulate different failure scenarios for purposes of system validation and testing failure recover logic, for example.

It should again be emphasized that the above-described embodiments of the invention are presented for purposes of illustration only. Many variations may be made in the particular arrangements shown. For example, although described in the context of particular system and device configurations, the techniques are applicable to a wide variety of other types of data processing systems, processing devices and distributed virtual infrastructure arrangements. In addition, any simplifying assumptions made above in the course of describing the illustrative embodiments should also be viewed as exemplary rather than as requirements or limitations of the invention. Numerous other alternative embodiments within the scope of the appended claims will be readily apparent to those skilled in the art.

The invention claimed is:

1. A system, comprising:
   a processing platform comprising hardware resources; and
   a simulated computing system executing on top of the processing platform using the hardware resources;
   wherein the simulated computing system comprises a plurality of simulated elements, the simulated elements comprising:
      a simulated compute node, the simulated compute node comprising a simulated hardware processor and a simulated storage device;
      a simulated network switch device; and
      a simulated power distribution device;
   a test control interface configured to enable a user to test the simulated computing system by injecting an error into the simulated computing system, wherein injecting an error comprises at least one of (i) manipulating a behavior of one or more of the simulated elements and (ii) simulating a failure of one or more of the simulated elements; and
   a management and orchestration platform executing on top of the simulated computing system, wherein the test control interface is configured to enable a user to inject the error into the simulated computing system to test a functionality of the management and orchestration platform;
   wherein the management and orchestration platform is configured to automatically initiate a response upon detection of the error;
   wherein the simulated computing system comprises a first hypervisor platform executing on top of the processing platform, and wherein the simulated network switch device comprises a plurality of simulated network switch devices that execute on the first hypervisor platform;
   wherein the simulated compute node comprises a second hypervisor platform, wherein the simulated hardware processor and the simulated storage device execute on the second hypervisor platform;
   wherein the second hypervisor platform executes on top of the first hypervisor platform; and
   wherein the plurality of simulated network switch devices comprises a first set of simulated network switch devices that implement a simulated in-band network, and a second set of simulated network switch devices that implement a simulated out-of-band network.

2. The system of claim 1, wherein manipulating the behavior of one or more of the simulated elements comprises changing firmware behavior of one or more of the simulated elements.

3. The system of claim 1, wherein the simulated compute node is configured to emulate a vendor-specific server node, wherein properties of the simulated hardware processor and simulated storage device comprises user-defined properties that emulate functionalities of a vendor-specific hardware processor and a vendor-specific storage device.

4. The system of claim 1, wherein the simulated computing system further comprises a simulated baseboard management controller (BMC) that is configured to monitor a state of one or more simulated elements of the simulated computing system, and wherein the test control interface is configured to enable the user to access and control the BMC and inject an error into the simulated computing system by user manipulation of the BMC.

5. The system of claim 1, wherein the processing platform comprises a plurality of server nodes, and wherein the simulated computing system comprises a simulated datacenter that executes on the server nodes and wherein the management and orchestration platform is implemented across the simulated datacenter.

6. The system of claim 1, wherein injecting an error comprises altering telemetry data of the one or more simulated elements, the telemetry data comprising one or more measurements of power usage, power consumption, network through-put, fan speed, voltage, current, and temperature, associated with the one or more simulated elements.

7. The system of claim 6, wherein the management and orchestration platform is configured to initiate a migration process in response to the telemetry data.

8. A method, comprising;
executing a simulated computing system on top of a processing platform using hardware resources of the processing platform, wherein the simulated computing system comprises a plurality of simulated elements, the simulated elements comprising a simulated compute node, a simulated network switch device, and a simulated power distribution device, wherein the simulated compute node comprises a simulated hardware processor and a simulated storage device;
presenting a test control interface that is configured to enable a user to test the simulated computing system by injecting an error into the simulated computing system, wherein injecting an error comprises at least one of (i) manipulating a behavior of one or more of the simulated elements and (ii) simulating a failure of one or more of the simulated elements; and
executing a management and orchestration platform executing on top of the simulated computing system, wherein the test control interface is configured to enable a user to inject error into the simulated computing system to test a functionality of the management and orchestration platform;
wherein the management and orchestration platform is configured to automatically initiate a response upon detection of the error;
wherein the simulated computing system comprises a first hypervisor platform executing on top of the processing platform, and wherein the simulated network switch device comprises a plurality of simulated network switch devices that execute on the first hypervisor platform;
wherein the simulated compute node comprises a second hypervisor platform, wherein the simulated hardware processor and the simulated storage device execute on the second hypervisor platform;
wherein the second hypervisor platform executes on top of the first hypervisor platform; and
wherein the plurality of simulated network switch devices comprises a first set of simulated network switch devices that implement a simulated in-band network, and a second set of simulated network switch devices that implement a simulated out-of-band network.

9. The method of claim 8, wherein manipulating the behavior of one or more of the simulated elements comprises manipulating changing firmware behavior of one or more of the simulated elements.

10. The method of claim 8, wherein the simulated compute node is configured to emulate a vendor-specific server node, wherein properties of the simulated hardware processor and simulated storage device are user-defined properties that emulate functionalities of a vendor-specific hardware processor and a vendor-specific storage device.

11. The method of claim 8, wherein the simulated computing system further comprises a simulated baseboard management controller (BMC) that is configured to monitor a state of one or more simulated elements of the simulated computing system, and wherein the test control interface is configured to enable the user to access and control the BMC and inject an error into the simulated computing system by user manipulation of the BMC.

12. An article of manufacture comprising a non-transitory processor-readable storage medium having encoded therein executable code of one or more software programs, wherein the one or more software programs when executed by one or more processing devices implement the method of claim 8.

13. The method of claim 8, wherein injecting an error comprises altering telemetry data of the one or more simulated elements, the telemetry data comprising one or more measurements of power usage, power consumption, network through-put, fan speed, voltage, current, and temperature, associated with the one or more simulated elements.

14. The method of claim 13, wherein the management and orchestration platform is configured to initiate a migration process in response to the telemetry data.

15. An article of manufacture comprising a non-transitory processor-readable storage medium having encoded therein executable code of one or more software programs, wherein the one or more software programs when executed by one or more processing devices implement a simulated computing system, wherein the executable code comprises:
executable code to generate a plurality of simulated elements of a simulated computing system, the simulated elements comprising a simulated compute node, a simulated network switch device, and a simulated power distribution device, the simulated compute node comprising a simulated hardware processor and a simulated storage device;
executable code to generate a test control interface configured to enable a user to test the simulated computing system by injecting an error into the simulated computing system, wherein executable code for injecting an error comprises executable code for at least one of (i) manipulating a behavior of one or more of the simulated elements and (ii) simulating a failure of the one or more simulated elements;
executable code for deploying the simulated computing system on a processing platform comprising hardware resources for executing the simulated computing system;
executable code to execute a management and orchestration platform on top of the deployed simulated computing system;
executable code to configure the test control interface to enable the user to test a functionality of the management and orchestration platform; and
executable code for the management and orchestration platform to automatically initiate a response upon detection of the error;
wherein the simulated computing system comprises a first hypervisor platform executing on top of the processing platform, and wherein the simulated network switch device comprises a plurality of simulated network switch devices that execute on the first hypervisor platform;
wherein the simulated compute node comprises a second hypervisor platform, wherein the simulated hardware processor and the simulated storage device execute on the second hypervisor platform;

wherein the second hypervisor platform executes on top of the first hypervisor platform; and wherein the plurality of simulated network switch devices comprises a first set of simulated network switch devices that implement a simulated in-band network, and a second set of simulated network switch devices that implement a simulated out-of-band network.

16. The article of manufacture of claim 15, wherein the executable code for manipulating the behavior of one or more of the simulated elements comprises executable code for changing firmware behavior of one or more of the simulated elements.

17. The article of manufacture of claim 15, wherein the executable code to generate a plurality of simulated elements comprises executable code to emulate the simulated compute node as vendor-specific server node by utilizing user defined properties for the simulated hardware processor and simulated storage device to emulate functionalities of a vendor-specific hardware processor and a vendor-specific storage device.

18. The article of manufacture of claim 15, further comprising:

executable code to generate a simulated baseboard management controller (BMC) that is configured to monitor a state of one or more simulated elements of the simulated computing system; and executable code to configure the test control interface to allow the user to access and control the BMC and inject an error into the simulated computing system by user manipulation of the BMC.

19. The article of manufacture of claim 15, wherein injecting an error comprises altering telemetry data of the one or more simulated elements, the telemetry data comprising one or more measurements of power usage, power consumption, network through-put, fan speed, voltage, current, and temperature, associated with the one or more simulated elements and wherein the management and orchestration platform is configured to initiate a migration process in response to the telemetry data.

20. The article of manufacture of claim 15, wherein the processing platform comprises a plurality of server nodes, and wherein the simulated computing system comprises a simulated datacenter that executes on the server nodes and wherein the management and orchestration platform is implemented across the simulated datacenter.

* * * * *